United States Patent [19]
Kumagai et al.

[11] Patent Number: 5,571,761
[45] Date of Patent: Nov. 5, 1996

[54] CERAMIC SUBSTRATE CIRCUIT SUBSTRATE

[75] Inventors: Motoo Kumagai, Yokohama; Keiichi Kato, Tokyo, both of Japan

[73] Assignee: Canon Kabushiki Kaisha, Tokyo, Japan

[21] Appl. No.: 235,240

[22] Filed: Apr. 29, 1994

Related U.S. Application Data

[63] Continuation of Ser. No. 39,689, Mar. 29, 1993, abandoned, which is a continuation of Ser. No. 794,643, Nov. 18, 1991, abandoned, which is a continuation of Ser. No. 633,178, Dec. 28, 1990, abandoned, which is a continuation of Ser. No. 88,411, Aug. 24, 1987, abandoned.

[30] Foreign Application Priority Data

| Aug. 22, 1986 | [JP] | Japan | 61-196913 |
| Aug. 22, 1986 | [JP] | Japan | 61-196914 |
| Aug. 23, 1986 | [JP] | Japan | 61-197706 |
| Aug. 23, 1986 | [JP] | Japan | 61-197707 |

[51] Int. Cl.$^6$ .............. C04B 35/46; H01G 4/22; H01G 4/20; H01G 4/06
[52] U.S. Cl. .......... 501/134; 361/319; 361/320; 361/321.1
[58] Field of Search .................. 501/134, 139; 428/497; 361/319, 320, 321.1

Primary Examiner—David Brunsman
Attorney, Agent, or Firm—Fitzpatrick, Cella, Harper & Scinto

[57] ABSTRACT

A ceramic substrate comprises having two or more functional portions separated from each other, by providing a first region comprising a first dielectric porcelain having an insulating layer at the crystal grain boundaries of a semiconductor porcelain containing a semiconductivizing agent and a second region comprising a second dielectric porcelain with different dielectric constant from the first dielectric porcelain through the difference in amount or kind of the semiconductivizing agent from the first region.

18 Claims, 6 Drawing Sheets

CERAMIC SUBSTRATE CIRCUIT SUBSTRATE

This application is a continuation of application Ser. No. 08/039,689 filed Mar. 29, 1993, now abandoned, which is a continuation of application Ser. No. 07/794,643 filed Nov. 18, 1991, abandoned, which is a continuation of application Ser. No. 07/633,178 filed Dec. 28, 1990, abandoned, which is a continuation of application Ser. No. 07/088,411, filed Aug. 24, 1987, abandoned.

BACKGROUND OF THE INVENTION

1. Field of the Invention

The present invention relates to a ceramic substrate (hereinafter abbreviated as a ceramic) which can be utilized as the electronic material such as dielectric porcelain substrate, etc., and a circuit substrate by use of the ceramic and a method for preparing the ceramic.

2. Related Background Art

In the prior art, electronic circuit substrates have been formed only a conductive circuit, of a conductive circuit and resistance, or of a conductive circuit, resistance and a capacitor of a limited range, and other functional components are mounted separately as elements onto the substrate.

For example, in a porcelain substrate of the prior art, the substrate was primarily one having conductors being mounted by the soldering of a chip component, etc. onto the substrate. For this reason, miniaturization of the electronic circuit has been limited. FIG. 1 shows an example of the prior art. 111 is a porcelain substrate, 112 a conductor circuit, 113 a resistor and 114 a chip capacitor.

In recent years, attempts have been made to build in a plurality of capacitors within the substrate by varying the dielectric constants within the same porcelain substrate. However, it has been very difficult to form different dielectric portions within the same substrate, and a substrate having a plurality of capacitors built therein has not been realized or practically applied except under the present invention, because of, for example, the cumbersomeness of preparing a laminated ceramic capacitor. Also, it would be important to make the high dielectric constant portions sufficiently separated from each other such that different functional portions operate without influence from each other within a limited structural space.

Further, the problems of separate built-in functional portions in such an electronic component or circuit substrate is not limited to a single dielectric porcelain but they are universally exhibited when two or more of the same or different functional portions are to be formed within a ceramic substrate.

SUMMARY OF THE INVENTION

A first object of the present invention is to provide a ceramic capable of having a plurality of functional portions built in to the substrate as sectional elements in a state sufficiently separated from each other.

A second object of the present invention is to provide a circuit substrate or an electronic circuit substrate capable of having a plurality of electronic components constituting units built into the substrate and yet in a stated sufficiently separated state as functional portions from each other by being formed of a ceramic capable of having a plurality of functional portions built in to the substrate as sectional elements in a state sufficiently separated from each other as described above.

The above first object of the present invention can be accomplished by a ceramic of the present invention, which comprises having two or more functional portions separated from each other, by providing a first region comprising a first dielectric porcelain containing a semiconductivizing agent and having an insulating layer at the crystal grain boundaries of a semiconductor porcelain and a second region comprising a second dielectric porcelain with different dielectric constant from the first dielectric porcelain because of a difference in amount or kind of the semiconductivizing agent from the first region.

The above second object can be accomplished by a circuit substrate of the present invention, which comprises having electrodes internal of or around the above ceramic of the present invention, and also having, if necessary, at least one of a conductor, resistor, and insulator, etc., and an electronic circuit substrate, which comprises having electrodes internal of or around the above ceramic of the present invention, and also having, if necessary, at least one of a conductor, resistor, and insulator, etc. and having an electronic circuit component mounted on the ceramic.

Also, another object of the present invention is to provide a method for preparing a ceramic capable of having functional portions sectioned in a state sufficiently separated from each other within the ceramic.

The above object can be accomplished by the method of preparing a ceramic of the present invention, which comprises the steps of forming at a predetermined portion on the surface of a formed material containing a first semiconductivizing agent a layer of a second semiconductivizing agent which is the same or different from the first semiconductivizing agent diffusing this into the formed material.

DESCRIPTION OF THE PREFERRED EMBODIMENTS

The ceramic of the present invention is utilized as an electronic material ceramic, examples of the functional portions which can be formed within the ceramic of the present invention may include dielectric members constituting capacitors or electronic components constituting elements such as conductors, semiconductors, resistors, insulators, diodes, transistors, etc. In the present invention, these functional portions can be formed in the above first region or the second region, and also in a combination of these regions, a combination of these regions with regions other than these regions, or even in third regions separate these regions.

Also, for example, by arrangement of two or more of the above first regions separated from each other with one of the above second regions interposed therebetween, or contrariwise by arrangement of two or more of the above second region separated from each other with one of the above first region interposed therebetween, two or more functional portions formed of the above first region or the second region can be formed under a state sufficiently separate from each other. Further, both the first and the second regions may be used as functional portions.

Figure 1:
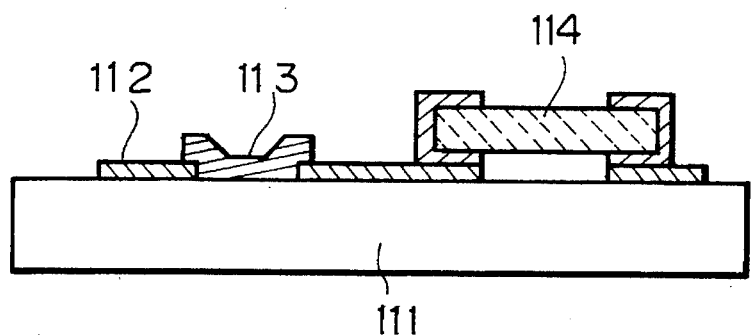
FIG. 1 is a schematic sectional view of the porcelain substrate of the prior art.
Figure 2:
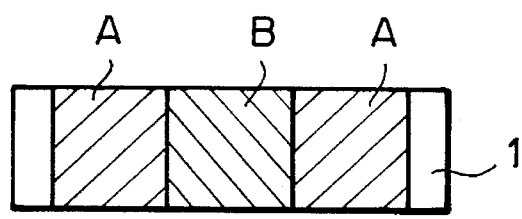
FIG. 2 through FIG. 4 are schematic sectional views showing examples of the shapes of the first region and the second region in the ceramic of the present invention, respectively.
Figure 3:
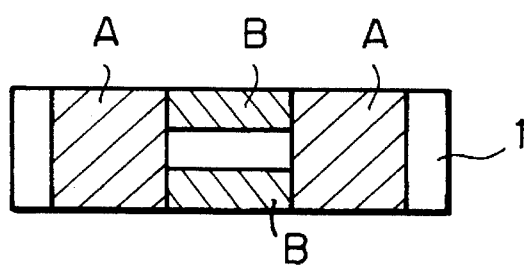
Figure 4:
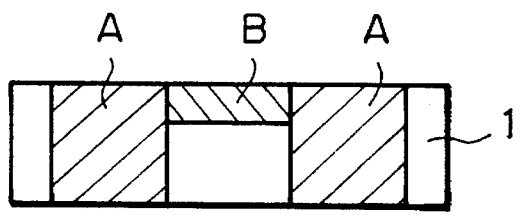

As an example of the ceramic of the present invention, for a plate-shaped dielectric porcelain substrate, FIG. 2 through FIG. 4 show examples of the shapes of the above first and second regions. Here, the functional portions are formed in the first region. In examples in FIG. 2 through FIG. 4, 1 is a plate-shaped dielectric porcelain substrate, A the first region and B the second region.

In FIG. 2, the second region B with a rectangular cross-section reaching both main surfaces of the plate-shaped dielectric porcelain substrate 1 is provided, with the two first regions A separated from each other with the region B sandwiched therebetween.

In the example shown in FIG. 3, the second regions B with rectangular cross-section are provided on the respective surface layer portions of the both main surfaces of the porcelain 1, and the two first regions A, first regions A separated from each other by these regions B sandwiched therebetween.

In the example shown in FIG. 4, the second region B with rectangular cross-section is provided on the surface layer portion of one main surface of the porcelain 1, and the two first regions A, A separated from each other with the region B sandwiched therebetween.

In the examples in FIG. 2 through FIG. 4, one or two second regions B are provided, but the number of the region is not limited thereto and can be determined corresponding to the number of the desired functional portions (the first region), and three or more regional can be provided, as a matter of course.

Also, as the second region, there may be also formed a group of two or more regions of different kinds which are different in dielectric constant from the first dielectric porcelain through the use of a different amount or kind of the semiconductivizing agent from the above first region, respectively.

When the above first region is made as a dielectric member constituting a capacitor, the first dielectric porcelain is required to have a high dielectric constant, and it is also desirable in addition to this that the characteristics of the capacitor constituted thereof such as dielectric loss, temperature change ratio of capacity, etc. should be preferable depending on the desired practical application.

In this case, the dielectric constant of the first dielectric porcelain should be preferably 35,000 or higher. With such a dielectric constant, even when the condition with respect to shape of ceramic may be taken into consideration, the capacitor can be formed to have a capacity of about 0.047 µF. Thus, for example, when used in a video circuit, etc., about half of all the kinds of ceramic chip capacitors used for general purpose can be formed within the ceramic. Also, when the first region is thus utilized as the high dielectric region, the dielectric constant of the first dielectric porcelain should be made preferably 5-fold or higher than the dielectric constant of the second dielectric porcelain. This is because it is the performance necessary for eliminating the effect between two functional portions, and by giving a difference of 5-fold or more in dielectric constant, the circuit can be very effectively miniaturized.

When the first region is made a high dielectric region, the first dielectric porcelain should be preferably composed mainly of SrO and $TiO_2$. Otherwise, although the dielectric constant tends to be lowered, those composed mainly of BaO and $TiO_2$, etc. may be applicable.

The quantitative rations of SrO and $TiO_2$ in the dielectric porcelain composed mainly of SrO and $TiO_2$ may be optimally 50.20 to 53.50 mol % for $TiO_2$ and 49.80 to 46.50 mol % for SrO, based on 100 mol % of the total amount of SrO and $TiO_2$.

If the amount of $TiO_2$ becomes larger, and the amount of SrO smaller, the dielectric constant of the desired dielectric porcelain is lowered, the dielectric loss and the temperature change in the dielectric constant become greater, and yet the insulating resistance of the porcelain is reduced. If the amount of $TiO_2$ becomes smaller, and the amount of SrO larger, the dielectric constant of the desired dielectric porcelain is lowered, and the temperature change in dielectric constant will become greater. The quantitative ratios of SrO and $TiO_2$ in the dielectric porcelain composed mainly of SrO and $TiO_2$ are determined so that the required characteristics such as dielectric constant, dielectric loss, temperature change in dielectric constant, insulating resistance of porcelain, semiconductivizability, etc. may be optimally exhibited with good balance.

In the dielectric porcelain composed mainly of SrO and $TiO_2$, Sr and/or Ti can be also substituted with other elements in order to realize more desirable characteristics.

AS the substituent element, Ba, Ca, Pb are preferred for Sr, while Zr and Sn for Ti.

Ca has the effect of making smaller the temperature coefficient of dielectric constant, improving sinterizing characteristic of porcelain as well as stabilizing various characteristics. The preferable amount of Ca substituted may be ratios of 0 to 0.30 mol of CaO in 1 mol of SrO.

Ba has the effect of enhancing dielectric constant. The preferable amount of Ba substituted may be ratios of BaO of 0 to 0.10 mol in 1 mol of SrO.

Pb has the effect of enhancing the sintering characteristic of porcelain more than Ca, and is advantageous in preparation process.

Sn has the effect of improving dielectric losses (tan δ), and also the action of enhancing the sintering characteristic of porcelain.

Zr contributed to improvement of the dielectric constant.

In the first dielectric porcelain, as other components, for the purpose of improving the properties of porcelain and stabilization of characteristics, for example, such components as $MnO_2$, $SiO_2$, ZnO, etc. can be contained. For example, preferable contents of $MnO_2$, $SiO_2$ are as follows:

$0.1 \leq MnO_2 \leq 5.0$ $0.01 \leq SiO_2 \leq 2.00$ (all are mol parts based on 100 mol parts of the main component of the first dielectric porcelain).

$MnO_2$, ZnO play a role as a sintering aid for forming porcelain, and the amount of $MnO_2$, for example, is made of 0.1 to 5.0 mol parts based on 100 mol parts of the main component, because the capacity change ratio of the desired capacitor becomes greater if $MnO_2$ is less than 0.1 mol parts, while dielectric loss becomes greater if it exceeds 5.0 mol parts.

$SiO_2$ has the effect of the grain interface improver of semiconductor porcelain. The grain interface improver can accomplish stabilization and uniformization of characteristics by making uniform diffusion of the additive onto the grain interfaces when after coating of an additive on the surface of the semiconductor porcelain, the additive is diffused onto crystal grain boundaries by first the porcelain in air. However, when $SiO_2$ is used to cause such an effect, if the amount of $SiO_2$ is used to cause such an effect, if the amount of $SiO_2$ is less than 0.001 mol parts based on 100 mol parts of the main component, no effect is sufficiently shown, while if the amount is over 2.0 mol parts, the dielectric constant of the desired capacitor will be unfavorably lowered.

As the above semiconductivizing agent to be used in the present invention, for example, on or two or more of Y, Dy, La, Nb, Sb, Ta, Ce, Nd, Cd, Al, $Pr_2O_3$, $ThO_2$, $Pm_2O_3$, $Eu_2O_3$, $Lu_2O_3$, $Tm_2O_3$, $Yb_2O_3$, etc. can be used.

These semiconductivizing agents can be used as suitably selected in order to balance of the characteristics of the dielectric member itself such as dielectric constant, and the characteristics of a capacitor such as dielectric loss, insulting resistance, temperature coefficient of dielectric constant, etc.

One specific feature of the present invention resides in making the second dielectric porcelain constituting the second region a porcelain different in dielectric constant from the first region through the use of a different kind or amount of the semiconductivizing agent. Accordingly, the second dielectric porcelain can be made substantially equal to the first dielectric porcelain in kind and amount of the components except for the semiconductivizing agent, or it can be made different in some or all of the components.

However, for permitting the first and second dielectric porcelains to coexist as an integral structure in the ceramic, it is required that they have some reactivity at their interface, but, it is also desirable that the reactivity should not be so great so as to avoid deformation from occurring at the bonded portion, the strength distribution may not vary to a great extent or stress may not be included.

The present invention utilizes the property of porcelain that its electrical characteristics are variable to great extent even by the change of a minute amount of semiconductivizing agent, and separation of the functional portions within the ceramic can occur. For example, as described in detail in Reference examples shown below, when the amount of $Y_2O_3$ is changed in a minute amount of around, for example, 1% in the $SrO$-$TiO_2$-$ZnO_2$-$Y_2O_3$ type porcelain, it has been confirmed that the dielectric constant will vary drastically between the order of some 100 and the order of some 10,000. Accordingly, without a great change in the composition of porcelain, regions with different dielectric constants can be formed by sectionalization and built into the same ceramic.

Such an effect also appears similarly when different kinds of semiconductivizing agents are used in combination.

Preferable amounts of semiconductivizing agents for making the first dielectric porcelain are shown below. (all are mol parts on 100 mol parts of the main component)

$0.06 \leq La_2O_3 \leq 1.47$
$0.06 \leq Y \leq 1.47$
$0.06 \leq Dy \leq 1.47$
$0.1 \leq La \leq 1.5$
$0.02 \leq Nb \leq 1.99$
$0.02 \leq Sb \leq 1.99$
$0.02 \leq Ta \leq 1.99$
$0.03 \leq Ce \leq 1.1$
$0.1 \leq Pr_2O_3 \leq 1.5$
$0.1 \leq ThO_3 \leq 1.5$
$0.1 \leq Pm_2O_3 \leq 1.5$
$0.1 \leq Sm_2O_3 \leq 1.5$
$0.1 \leq Eu_2O_3 \leq 1.5$
$0.1 \leq Lu_2O_3 \leq 1.5$
$0.1 \leq Tb_2O_3 \leq 1.5$
$0.1 \leq Tm_2O_3 \leq 1.5$
$0.1 \leq Yb_2O_3 \leq 1.5$ Specific embodiments of making the dielectric constant different between the first dielectric porcelain and the second dielectric porcelain are as follows:

By use of the same kind (including the case where two or more kinds are the same) of semiconductivizing agent, the amounts thereof are controlled.

Semiconductivizing agents of different kinds (including the case where at least one is different when containing two or more kinds) with different degrees of semiconductivizing modification are used. Also in this case, the amount can be controlled.

An example of the method for preparation of the ceramic of the present invention is described below. Here, the porcelain forming composition constituting the semiconductor porcelain of the first region is called $C_1$ and the porcelain forming composition constituting the semiconductor porcelain of the above second region $C_2$.

Figure 7A:
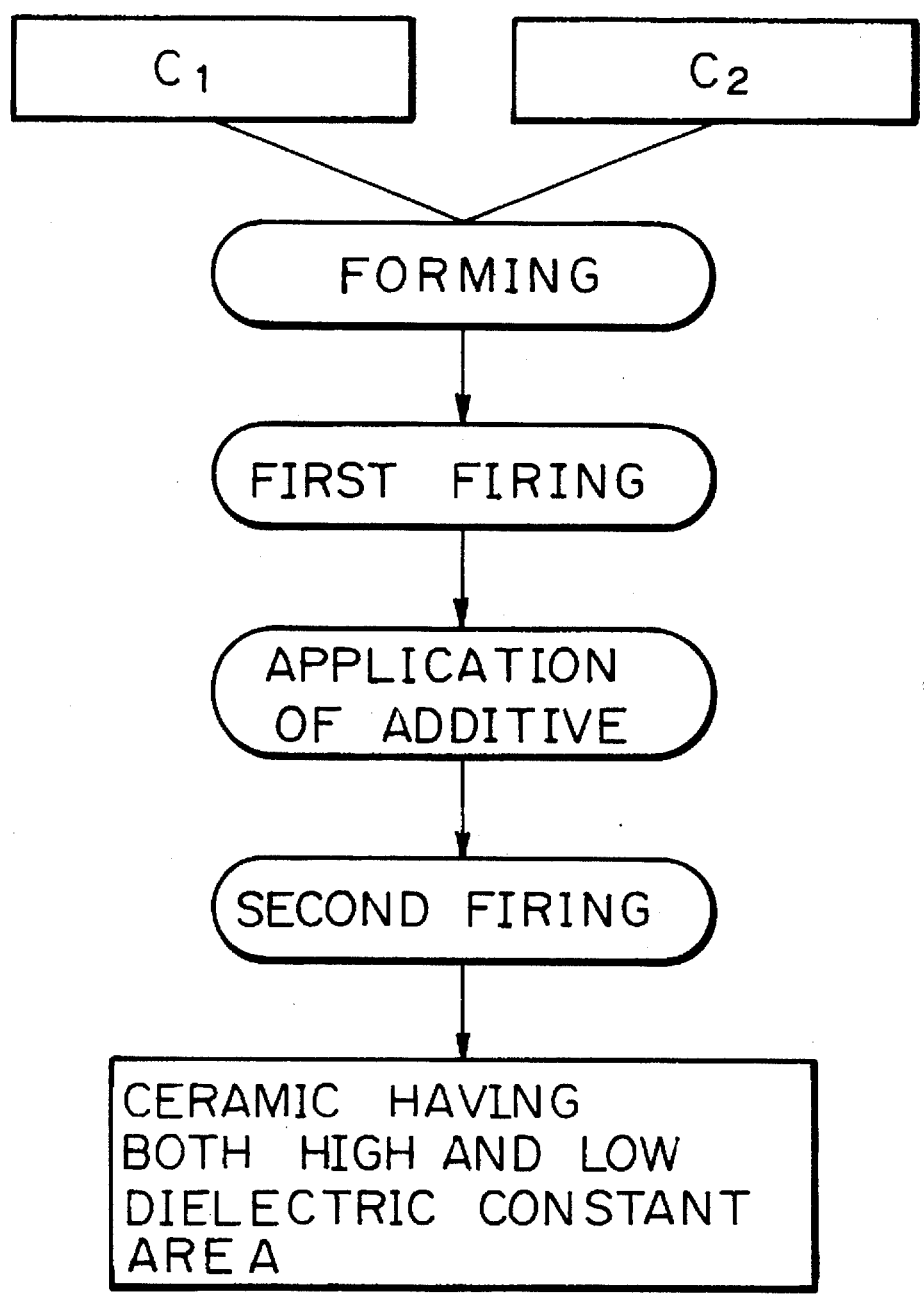
FIG. 7A is a diagram for illustration of the steps for preparation of the ceramic.

This preparation example can be practiced according to the steps as shown in FIG. 7A.

Figure 5A:
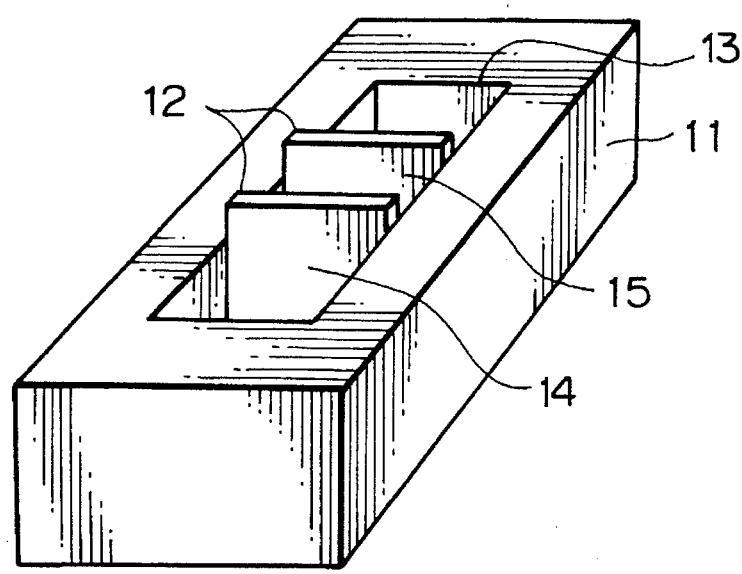
FIG. 5A is a schematic perspective views of the mold for preparing the ceramic of the present invention used in Examples.
Figure 6:
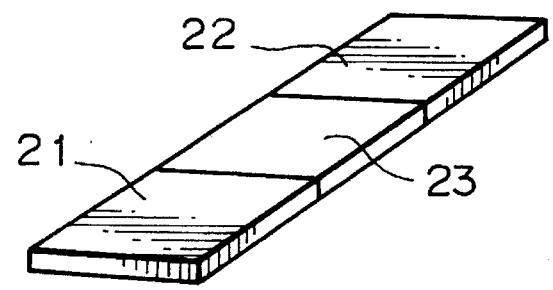
FIG. 6 is a schematic perspective view of the ceramic prepared by use of the formed material.

That is, by providing removable partitioning plates 12 in a mold 11 as shown in FIG. 5A, 13, 14 are filled with $C_1$, while 15 is filled with $C_2$, followed by removal of the participating plates. And, compression forming is carried out. Here, the formed material is shown in FIG. 6. 21, 22 are filled with the group of particles of $C_1$, while 23 with the group of particles of $C_2$. This formed material is subjected to first firing to make the portion of $C_1$ semiconductivizing, and then, for example, by coating the surface of the semiconductive porcelain thus obtained with an additive which becomes the diffusive component onto the grain boundaries, followed by secondary firing to form an insulting layer at the crystal grain boundaries of the semiconductor porcelain constituted of $C_1$, thus making a dielectric porcelain.

First firing may be conducted in a reducing atmosphere of a gas mixture of hydrogen and nitrogen, hydrogen and argon, etc. or a neutral atmosphere such as nitrogen, argon, more preferably in a reducing atmosphere, desirably at 1320° to 1450° C. to obtain a semiconductor porcelain.

Second firing should be desirably conducted in an oxidizing atmosphere at 1100° to 1300° C.

As the additive, any of the additives known in the art for forming an insulating layer at the crystal grain boundaries of semiconductor porcelain can be used. For example, in addition to oxides of manganese, bismuth, vanadium, lead, chromium, iron, cobalt, nickel, copper, astatine, antimony, thallium, etc., those particularly preferably used in the present invention are boron oxide and sodium oxide, and good results can be obtained when these are used. The additive may form these oxides as the result of firing, and they may be in the form of, for example, oxides, nitrides, carbonates, etc. when fed onto the surface of the semiconductor porcelain.

Figure 8:
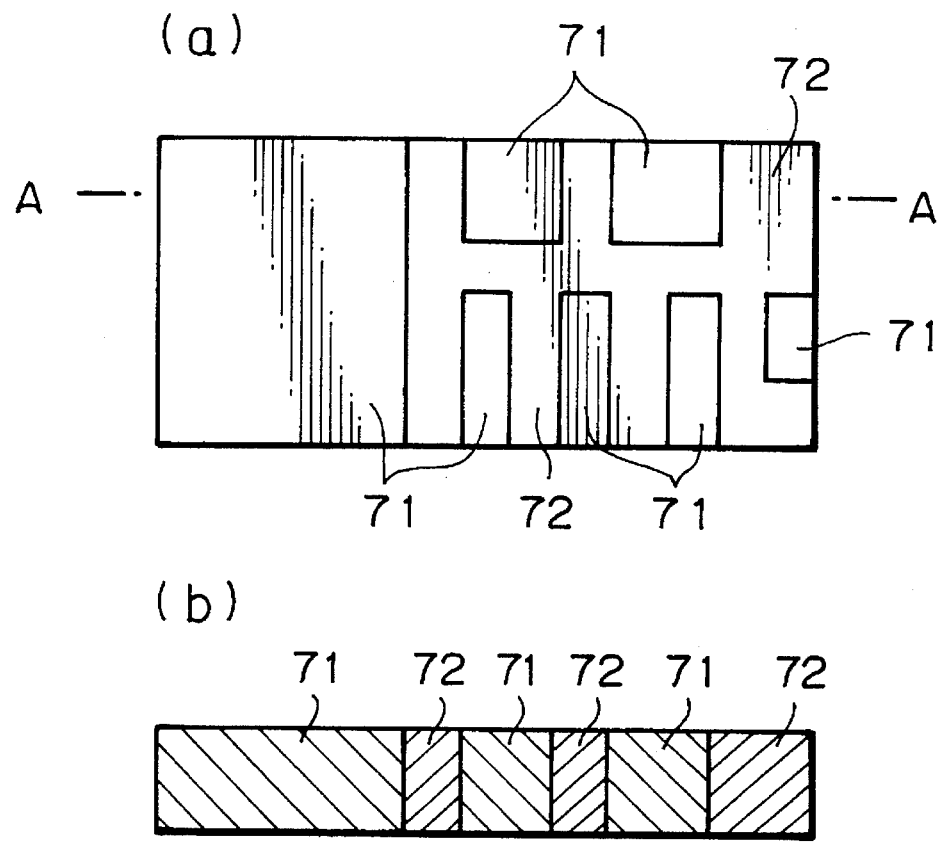
FIG. 8A is a plan view showing the constitutional example of the ceramic of the present invention.
FIG. 8B is a sectional view taken along A—A in FIG. 8B.

An example of the shape of the ceramic of the present invention is shown on FIG. 8A (plan view), FIG. 8B (cross-sectional view taken along A—A in FIG. 8A).

The ceramic shown in FIGS. 8A, 8B has a plurality of regions 71, 71, 71 . . . each with a high dielectric constant formed by sectionalization internally of the plate-shaped dielectric porcelain 1, and these regions are separated from each other with the regions 72, 72, 72 . . . each with a low dielectric constant.

Next, the circuit substrate of the present invention is characterized by having electrodes internally or around the ceramic of the present invention and also having, if necessary, at least one functional component of conductors, resistors, and insulators, etc.

Figure 9:
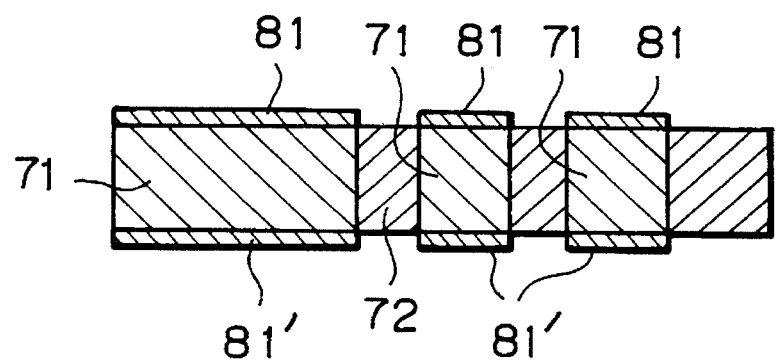
FIG. 9 and FIG. 10 are each schematic sectional view showing an example of the construction of the circuit substrate of the present invention.

To represent the same element with the same symbol as a constructed example of the circuit substrate of the present invention, the circuit substrate shown in FIG. 9 has the group of a pair of electrodes 81, 81', 81, 81', 81, 81' . . . formed of thick films of an electroconductive paste such as silver paste on both main surfaces of the respective high dielectric constant regions of the ceramic shown in FIGS. 8A and 8B.

Figure 10:
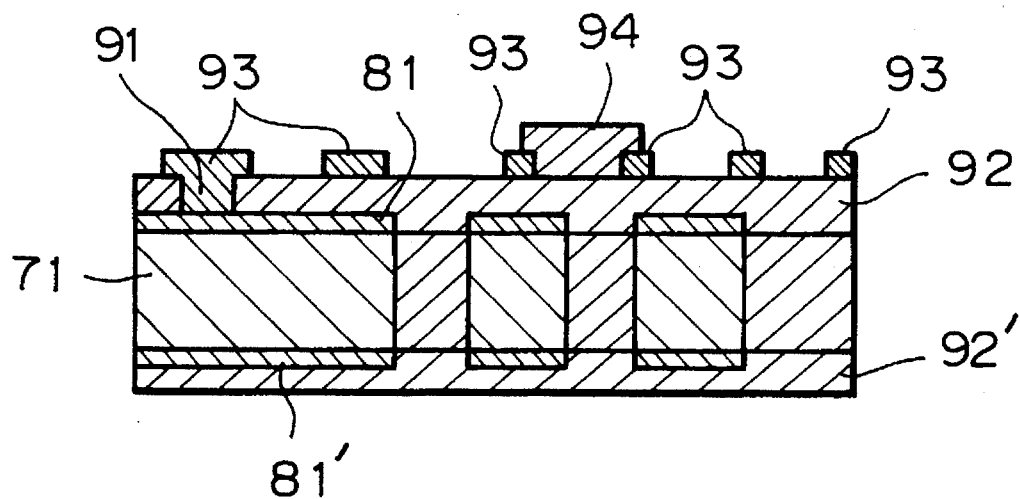

The example of the circuit substrate shown in FIG. 10 is the circuit substrate shown in FIG. 9, which is further provided with insulating layers 92, 92', formed with the beer hole portion 91 optionally provided by screen printing of an insulator paste such as glass, etc. remaining, and the electroconductive circuit portion 93 and the resistor portion 94 printed internally of the via hole 91 and on the insulating layers.

Further, the electronic circuit substrate of the present invention is characterized by having electrodes internally of or around the ceramic of the present invention, existence of at least one of the functional components of conductors, resistors, insulators, etc., and also a mounting of electronic circuit components on the ceramic.

Figure 11:
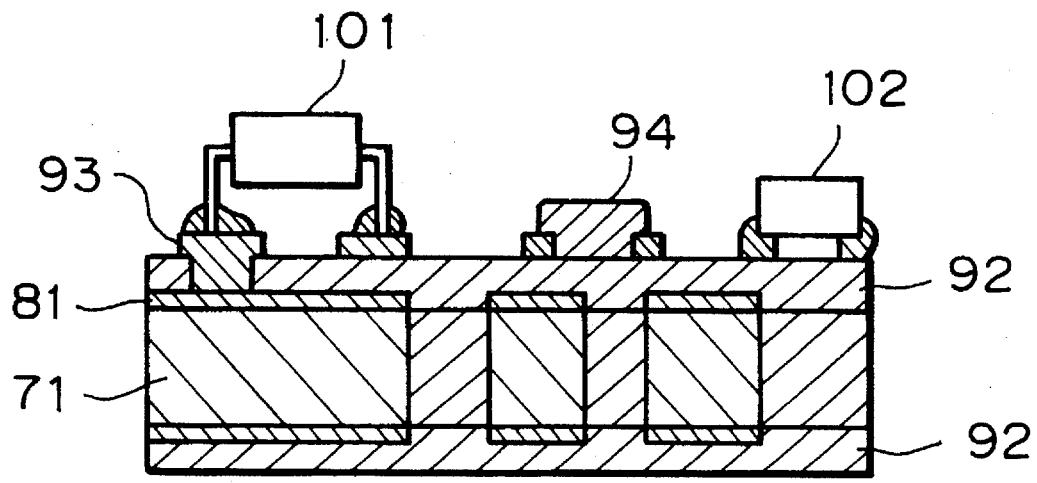
FIG. 11 is a schematic sectional view showing an example of the construction of the electronic circuit substrate of the present invention.

To represent the same element with the same symbol, for example, the electronic circuit substrate shown in FIG. 11 is the circuit substrate shown in FIG. 10, having a flat pack IC chip 101 and a chip component 102 connected to the conductor circuit portion 92 mounted thereon.

One specific feature of the present invention is to make the second dielectric porcelain forming the second region a porcelain with different dielectric constant through a different kind or amount of the semiconductivizing agent from the first region. Accordingly, the second dielectric porcelain can be made substantially equivalent in kind and amount of the components to the first dielectric porcelain except for the semiconductivizing agent, or the second region can be formed with a porcelain different in a part or all of the other components.

However, in order for the first and the second dielectric porcelains to exist as an integral structure in the ceramic, it is required that they have reactivity at the interface thereof, and also it is desirable that the reactivity not be so great so as to avoid deformation from occurring at the bonded portion, the strength distribution should not be greatly changed or stress should not be added.

The present invention utilizes the property of porcelain that its electrical characteristics are variable to great extent even by a minute change in the amount of the semiconductivizing agent, and separate of the functional portions within the ceramic has been rendered possible. For example, as described in detail in Reference examples shown below, when the amount of $WO_3$ is changed by a minute amount of, for example, around 1%, it has been confirmed that the dielectric constant will vary drastically between the order of some 100 and the order of some 10,000. Accordingly, without changing the composition of porcelain greatly, regions with different dielectric constants can be formed by sectionalization and built into the same ceramic.

Such an effect also appears similarly when different kinds of semiconductivizing agents are used in combination with $WO_3$.

As the semiconductivizing agent which can be used in combination with $WO_3$, there may be included, for example, one or two or more of Y, Dy, La, Nb, Sb, Ta, Ce, Nd, Cd, Al, $Pr_2O_3$, $ThO_2$, $Pm_2O_3$, $Sm_2O_3$, $Eu_2O_3$, $Lu_2O_3$, $Tb_2O_3$, $Tm_2O_3$, $Yb_2O_3$, etc.

These semiconductivizing agents are mixed in combination with $WO_3$ in the first dielectric porcelain and/or the second dielectric porcelain. Also, the semiconductivizing agent contained in the second dielectric porcelain can be made only those other than $WO_3$.

Specific embodiments of making the dielectric constant different between the first dielectric porcelain and the second dielectric porcelain are as follows:

By use of the same kind (including the case when two or more kinds are the same) of semiconductivizing agent, the amounts thereof are controlled.

Semiconductivizing agents of different kinds (including the case where at least one is different when containing two ore more kinds) with different degrees of semiconductivization are used. Also in this case, the amount can be controlled.

Examples of preferable porcelain composition for making the first region highly dielectric member are shown below.

(1) A porcelain forming composition containing 0.1 to 5.0 mol parts (more preferably 3.0 to 5.0 mol parts) of $MnO_2$ and 0.05 to 0.30 mol parts of $WO_3$ per 100 mol parts of the main components comprising 50.20 to 53.50 mol % of $TiO_2$ and 49.80 to 46.50 mol % of SrO.

(2) A porcelain forming composition containing 0.1 to 5.0 mol parts (more preferably 3.0 to 5.0 mol parts) of $MnO_2$, 0.05 to 0.30 mol parts of $WO_3$ and 0.01 to 2.00 mol parts of $SiO_2$ per 100 mol parts of the main components comprising 50.20 to 53.50 mol % of $TiO_2$ and 49.80 to 46.50 to 46.50 mol % of SrO.

According to the present invention, through diffusion of the above semiconductivizing agent, portions with different amounts or components of the semiconductivizing agent are formed within the same material. These portions can be utilized as the region with different characteristics by selecting the amount and the kind of the semiconductivizing agent used, and can be also utilized as desired as various functional portions, or as the region for separating the functional portions, etc. Accordingly, by forming one or two or more portions in which the semiconductivizing agent is diffused within the ceramic, functional portions of a desired number of one or two or more can be sectionalized under sufficiently separated state.

When the ceramic prepared according to the method of the present invention is utilized as the electronic material ceramic, the above functional portions constituted of the portions in which the semiconductivizing agent is diffused may be any functional portion which can be formed by a material containing the semiconductivizing agent, as exemplified by electronic component constituting units such as semiconductors, dielectric members for constituting capacitors, conductors, resistors, insulators, diodes, transistors, etc. On the other hand, the region for separately the above functional portions constituted of the portions where the semiconductivizing agent is diffused may be, for example, insulators, as contrasted to semiconductors, conductors and resistors lower dielectric constant regions as contrasted to higher dielectric constant regions for constituting capacitors, and the like.

For example, when a region of a dielectric member forming a capacitor is created as the functional portion, the region having the semiconductivizing agent according to the present invention diffused therein can be utilized as the region for separating the regions of the dielectric members forming the above capacitor. That is, as one example, by utilizing the property that the electric characteristics of porcelain are abruptly changed according to the amount (or kind) of the semiconductivizing agent, a region made to have a lower dielectric constant can be formed by diffusing an excessive amount of a semiconductivizing agent into the formed material containing desired the amount and kind of a semiconductivizing agent for obtaining a high dielectric constant.

The above formed material used in the present invention may be generally a formed material which is a precursor for forming a porcelain (powder compact or calcined material of powder compact), but also a formed material already formed into porcelain, or a formed material prepared by crushing porcelain followed by molding again into a powder compact may be used.

Diffusion of the semiconductivizing agent is effected generally through thermal diffusion by firing. Accordingly, it is industrially very advantages to use the formed material which is a precursor for forming the above porcelain, since thermal diffusion and porcelain formation (vitrification) by firing can be effected at the same time. In this case, firing may be preferably conducted in a reducing atmosphere or an inert atmosphere.

Examples of reducing atmosphere may include gas mixtures of hydrogen and nitrogen, hydrogen and argon, etc.

An example of inert atmosphere may be argon, etc.

On the other hand, formation of the semiconductivizing agent layer can be practiced according to, for example, printing spraying, chemical vapor deposition, vapor deposition, dipping, etc.

When a dielectric porcelain substrate as shown in FIG. 2 through FIG. 4 is to be prepared according to the method of the present invention, after the diffusion step of the above semiconductivizing agent, the step of forming an insulating layer at the crystal grain boundaries of the porcelain is practiced. This step is generally performed by coating all or a predetermined portion of the semiconductor porcelain surface with an additive, followed by firing. Firing may be preferably conducted in an oxidizing atmosphere at 1100° to 1300° C.

The present invention is described in more detail by referring to the following Reference examples and

Reference Examples 1–27

Powder compacts (diameter 16 mm, height 0.7 mm) with the compositions shown in Table 1 were prepared, fired in the air at 1320° C. for 4 hours subsequently in a reducing atmosphere containing 10% of hydrogen and 90% of nitrogen at 1300° C. for 2 hours to prepare semiconductor porcelains. Next, the porcelains were dipped in grain boundary insulating agents with the components shown in Table 1, followed by firing in an oxidizing atmosphere at 1300° C. for 2 hours to form insulating layers at a crystal grain boundaries of semiconductor porcelains.

The dielectric porcelain thus obtained was coated with a silver paste, baked at 900° C. for 30 minutes to form a pair of electrodes, and the dielectric constant of the dielectric porcelain was measured. The results are shown in Table 1.

As is apparent from Table 1, it can be understood that the dielectric constant is greatly changed by varying the amount or the kind of the semiconductivizing agent.

EXAMPLES 1–9

Following the schematic illustration of the steps shown in FIG. 7A, of the compositions for forming dielectric porcelains of Reference examples 1 to 27 shown in the Table 1, by use of the combinations shown in Table 2 as the composition with high dielectric constant ($C_1$) and the composition with low dielectric constant ($C_2$), partitioning plates 12 were placed vertically in a mold 11 shown in FIG. 5A and $C_1$ was filled in the spaces 13, 14 and $C_2$ in the space 15. Then, semiconductivization was effected under the same conditions as in Reference examples 1 to 27, and a grain boundary insulating layer was formed by used of the same grain boundary insulating agent as that used for $C_1$ shown in Table 1 under the same firing conditions to prepare a ceramic having two regions with high dielectric constants 21, 22, separated from each other through an intermediary region 23 with low dielectric constant as shown in FIG. 6.

On both main surfaces of the regions with high dielectric constants 21, 22 of the ceramic thus obtained, electrodes were formed similarly as in the Reference examples, and the capacitor characteristics were measured. The results are shown in Table 2.

Reference Examples 28–58

Powder compacts (diameter 16 mm, height 0.7 mm) with the compositions shown in Table 3 were prepared, fired in the air at 1320° C. for 4 hours subsequently in a reducing atmosphere containing 10% hydrogen and 90% of nitrogen at 1300° C. for 2 hours to prepare semiconductor porcelains. Next, the porcelains are dipped in grain boundary insulating agents with the components shown in Table 3, followed by firing in an oxidizing atmosphere at 1300° C. for 2 hours to form insulating layers at the crystal grain boundaries of semiconductor porcelains.

The dielectric porcelain thus obtained was coated with a silver paste, baked at 900° C. for 30 minutes to form a pair of electrodes, and the dielectric constant of the dielectric porcelain was measured. The results are shown in Table 3.

As is apparent from Table 3, it can be understood that the dielectric constant is greatly changed by varying the amount or the kind of the semiconductivizing agent.

EXAMPLES 10–28

Following the schematic illustration of the steps shown in FIG. 7A, of the compositions for forming dielectric porcelains of References examples 28–58 shown in Table 3, by use of the combinations shown in Table 4 of the composition with high dielectric constant ($C_1$) and the composition with low dielectric constant ($C_2$), partitioning plates 12 were placed vertically in a mold 11 shown in FIG. 5A and $C_1$ was filled in the spaces 13, 14 and $C_2$ in the space 15. Then, semiconductivization was effected under the same conditions as in Reference examples 28 to 58, and a grain boundary insulating layer was formed by use of the same grain boundary insulating agent as that used for $C_1$ shown in Table 3 under the same firing conditions to prepare a ceramic having two regions with high dielectric constants 21, 22, separated from each other through an intermediary region 23 with low dielectric constant as shown in FIG. 6.

On both main surfaces of the regions with high dielectric constants 21, 22 of the ceramic thus obtained, electrodes were formed similarly as in the Reference examples, and the capacitor characteristics were measured. The results are shown in Table 4.

EXAMPLES 29–38

Figure 7B:
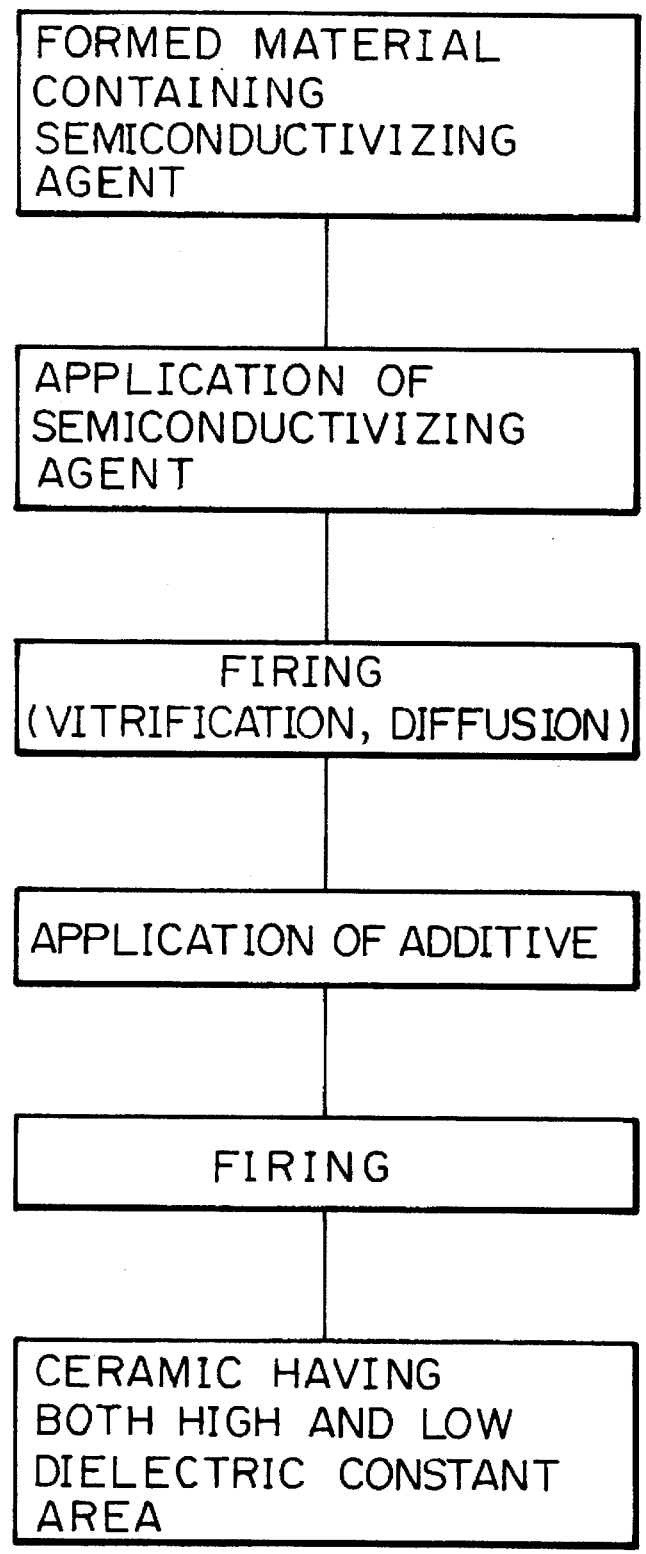
FIG. 7B is a diagram for illustration of the steps for preparation of the ceramic by use of the formed material shown in FIG. 5B as the starting material.

FIG. 7B illustrates schematically the steps for preparation of the dielectric porcelain substrate for electronic circuits according to the method of the present invention.

Figure 5B:
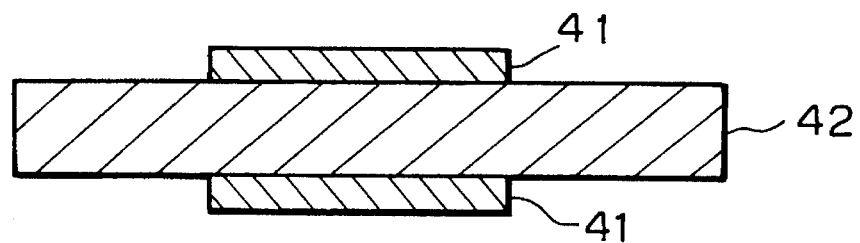
FIG. 5B is a schematic sectional view of a formed material having the semiconductivizing agent layer used in the method of the present invention.

In these Examples, plate-shaped molded products (20× 15×1.0t) with the compositions shown in Table 5 were prepared and then the molded products 42 coated by screen printing on both surfaces with the paste of the oxide shown in Table 5 in an amount of about 8 mg as the layer 41 of the semiconductivizing agent as shown in FIG. 5B were fired under a reducing atmosphere at 1360° C. for 4 hours. Subsequently, on the whole surfaces of the both main surfaces of the porcelain thus obtained, the grain boundary insulating agent shown in Table 5 were applied and fired under an oxidizing atmosphere at 1250° C. for 0.5 hour to prepare a ceramics provided with the regions 21, 22 with high dielectric constants at both ends and the region 23 with low dielectric constant therebetween as shown in FIG. 6. Next, silver electrodes are provided on the regions 21 and 22, and the respective dielectric constants of the region 23 where diffusion of the semiconductivizing agent layer was effected and the regions 21, 22 where no such diffusion was effected were measured. The results are shown in Table 5.

Reference Examples 59–62, Examples 39–53

FIG. 7B illustrates schematically the steps for preparation of the dielectric porcelain substrate for electronic circuits according to the method of the present invention.

In these Examples, plate-shaped molded products (20× 15×1.0t) with the compositions shown in Table 6 were prepared and then the molded products 42 coated by screen printing on both surfaces with the paste of the oxide shown in Table 6 in an amount of about 8 mg as the layer 41 of the semiconductivizing agent as shown in FIG. 5B were fired under a reducing atmosphere at 3360° C. for 4 hours. Subsequently, on the whole surfaces of the both main surfaces of the porcelain thus obtained, the grain boundary insulating agents shown in Table 6 were applied and fired under an oxidizing atmosphere at 1250° C. for 0.5 hour to prepare a ceramics provided with the regions 21, 22 with high dielectric constants at both ends and the region 23 with low dielectric constant therebetween as shown in FIG. 6. Next, silver electrodes are provided on the regions 21 and 22, and the respective dielectric constants of the region 23 where diffusion of the semiconductivizing agent layer was effected and the regions 21, 22 where no such diffusion was effected were measured. The results are shown in Table 6.

According to the ceramic of the present invention, a plural number of functional portions can be built in under the state sufficiently space from each other.

Also, according to the circuit substrate and the electronic circuit substrate of the present invention, by being constituted of a ceramic capable of having a plural number of functional portions built in as sectionalized so that they are sufficiently separated from each other as described above, a plural number of electronic part constituting units can be built in under the state sufficiently separated from each other as the element functional portions.

According to the method for preparing a ceramic of the present invention, a ceramic having a plural number of functional portions built in under the state sufficiently separated from each other can be prepared.

TABLE 1

| Reference Example No. | Semiconductor porcelain composition ||||||| Dielectric constant (*specific dielectric constant; others are apparent specific dielectric constant) |
|---|---|---|---|---|---|---|---|---|
| | Main components (mol %) ||  Sintering aid || Semi-conductivizing agent mol parts based on 100 mol parts of main components || Grain boundary insulating agent component(s) | |
| | $TiO_2$ | SrO, etc. | | | | | | |
| 1 | 51.00 | SrO 49.00 | ZnO | 10.9 | $Y_2O_3$ | 0 | $Bi_2O_3$ | *390 |
| 2 | " | SrO 49.00 | ZnO | 10.9 | " | 0.1 | " | 6,800 |
| 3 | " | SrO 49.00 | ZnO | 10.9 | " | 0.3 | " | 23,000 |
| 4 | " | SrO 49.00 | ZnO | 10.9 | " | 0.5 | " | 47,000 |
| 5 | " | SrO 49.00 | ZnO | 10.9 | " | 0.7 | " | 56,000 |
| 6 | " | SrO 49.00 | ZnO | 10.9 | " | 0.85 | " | 51,000 |
| 7 | " | SrO 49.00 | ZnO | 10.9 | " | 1.0 | " | 42,000 |
| 8 | " | SrO 49.00 | ZnO | 10.9 | " | 1.2 | " | 28,000 |
| 9 | " | SrO 49.00 | ZnO | 10.9 | " | 1.4 | " | 17,000 |
| 10 | " | SrO 49.00 | ZnO | 10.9 | " | 1.6 | " | 6,900 |
| 11 | " | SrO 49.00 | ZnO | 10.9 | $La_2O_3$ | 0.7 | " | 47,000 |
| 12 | " | SrO 49.00 | ZnO | 10.9 | $Dy_2O_3$ | 0.7 | " | 53,000 |
| 13 | | SrO 39.00 CaO 10.00 | | | $Y_2O_3$ | 0.15 | $Bi_2O_3/CuO = $ 9:1 (Firing: 1150° C./hr) | 38,000 |

TABLE 1-continued

| Reference Example No. | Main components (mol %) TiO$_2$ | SrO, etc. | Sintering aid mol parts based on 100 mol parts of main components | | Semi-conductiviz-ing agent | | Grain boundary insulating agent component(s) | Dielectric constant (*specific dielectric constant; others are apparent specific dielectric constant) |
|---|---|---|---|---|---|---|---|---|
| 14 | | SrO 47.00 BaO 2.00 | | | Y$_2$O$_3$ | 0.15 | Bi$_2$O$_3$/CuO = 9:1 (Firing: 1150° C./hr) | 42,000 |
| 15 | 50.50 | 49.50 | MnO$_2$ | 0.3 | Yb$_2$O$_3$ | 0.5 | Bi$_2$O$_3$/CuO = 9:1 (Firing: 1150° C./hr) | 48,000 |
| 16 | " | " | " | 0.8 | Eu$_2$O$_3$ | 0.8 | Bi$_2$O$_3$/CuO = 9:1 (Firing: 1150° C./hr) | 40,000 |
| 17 | " | " | " | 1.2 | Sm$_2$O$_3$ | 1.5 | Bi$_2$O$_3$/CuO = 9:1 (Firing: 1150° C./hr) | 43,000 |
| 18 | " | " | " | 2.0 | Sm$_2$O Pm$_2$O$_3$ | 0.2 0.4 | Bi$_2$O$_3$/CuO = 9:1 (Firing: 1150° C./hr) | 47,000 |
| 19 | " | " | " | " | Nb$_2$O$_5$ | 0.3 | Bi$_2$O$_3$ | 42,000 |
| 20 | " | " | " | " | Nb$_2$O$_5$ | 1.0 | " | 6,500 |
| 21 | 51.00 | SrO 39.00 CaO 10.00 | ZnO | 10.9 | — | | Bi$_2$O$_3$/CuO = 9:1 | *900 |
| 22 | " | SrO 47.00 BaO 2.00 | " | 10.9 | — | | Bi$_2$O$_3$/CuO = 9:1 | 4,000 |
| 23 | 50.50 | 49.50 | MnO$_2$ | 0.3 | Yb$_2$O$_5$ | 1.5 | Bi$_2$O$_3$/CuO = 9:1 | 5,600 |
| 24 | " | " | " | 0.8 | Eu$_2$O$_3$ | 1.8 | Bi$_2$O$_3$/CuO = 9:1 | 4,800 |
| 25 | " | " | " | 1.2 | Sm$_2$O$_3$ Pm$_2$O$_3$ | 1.5 0.5 | Bi$_2$O$_3$/CuO = 9:1 | 3,800 |
| 26 | " | " | " | 2.0 | Sm$_2$O$_3$ Pm$_2$O$_3$ | 0.2 1.0 | Bi$_2$O$_3$/CuO = 9:1 | 6,500 |
| 27 | 51.50 | 48.50 | " | 2.0 | | | Bi$_2$O$_3$/CuO = 9:1 | *390 |

TABLE 2

| | C$_1$ | C$_2$ | Dielectric constant | tan δ (%) | Insulating resistance (MΩ) | Temperature change rate (%, Standard: 25° C.) −25° C. | +85° C. |
|---|---|---|---|---|---|---|---|
| Example 1 | Reference Example 5 | Reference Example 1 | 56,000 | 0.25 | 45,000 | −9.8 | +9.5 |
| Example 2 | Reference Example 6 | Reference Example 10 | 51,000 | 0.32 | 38,000 | — | — |
| Example 3 | Reference Example 13 | Reference Example 21 | 38,000 | 0.28 | 47,000 | +3.3 | −3.0 |
| Example 4 | Reference Example 14 | Reference Example 22 | 42,000 | 0.38 | 39,000 | +4.3 | −3.4 |
| Example 5 | Reference Example 15 | Reference Example 23 | 48,000 | 0.6 | 3,000 | +9 | −6 |
| Example 6 | Reference Example 16 | Reference Example 24 | 40,000 | 0.6 | 2,700 | +7 | −6 |
| Example 7 | Reference Example 17 | Reference Example 25 | 43,000 | 0.7 | 2,100 | +7 | −6 |
| Example 8 | Reference | Reference | 47,000 | 0.9 | 3,600 | +6 | −8 |

TABLE 2-continued

| | | | Dielectric constant | tan δ (%) | Insulating resistance (MΩ) | Temperature change rate (%, Standard: 25° C.) | |
|---|---|---|---|---|---|---|---|
| | $C_1$ | $C_2$ | | | | −25° C. | +85° C. |
| Example 9 | Example 18 Reference Example 19 | Example 26 Reference Example 27 | 42,000 | 8 | 5,600 | +8 | −9 |

TABLE 3

| | Semiconductor porcelain composition | | | | | | |
|---|---|---|---|---|---|---|---|
| Reference Example No. | Main components (mol %) | | Sintering aid | Semi-conductiviz-ing agent mol parts based on 100 mol parts of main components | | Grain boundary insulating agent component(s) | Dielectric constant (*specific dielectric constant; others are apparent specific dielectric constant) |
| | $TiO_2$ | SrO, etc. | | | | | |
| 28 | 51.00 | SrO 49.00 | $MnO_2$ 3.5 | $WO_3$ | | $B_2O_3$ | *370 |
| 29 | " | SrO 49.00 | $MnO_2$ 3.5 | " | 0.02 | " | 50,000 |
| 30 | " | SrO 49.00 | $MnO_2$ 3.5 | " | 0.04 | " | 68,000 |
| 31 | " | SrO 49.00 | $MnO_2$ 3.5 | " | 0.06 | " | 82,000 |
| 32 | " | SrO 49.00 | $MnO_2$ 3.5 | " | 0.12 | " | 101,000 |
| 33 | " | SrO 49.00 | $MnO_2$ 3.5 | " | 0.20 | " | 105,000 |
| 34 | " | SrO 49.00 | $MnO_2$ 3.5 | " | 0.27 | " | 90,000 |
| 35 | " | SrO 49.00 | $MnO_2$ 3.5 | " | 0.31 | " | 80,000 |
| 36 | " | SrO 49.00 | $MnO_2$ 3.5 | " | 0.35 | " | 48,000 |
| 37 | " | SrO 49.00 | $MnO_2$ 3.5 | " | 0.40 | " | 12,000 |
| 38 | " | SrO 49.00 | $MnO_2$ 3.5 | " | 0.50 | " | 4,000 |
| 39 | " | SrO 39.00 CaO 10.00 | $MnO_2$ 3.5 | 0 $WO_3$ | 0.15 0.15 | " | 78,000 |
| 40 | " | SrO 39.00 BaO 39.00 | $MnO_2$ 3.5 | " | 0.15 | " | 85,000 |
| 41 | " | SrO 49.00 | $MnO_2$ 3.5 | $WO_3$ $Nb_2O_5$ | 0.12 0.3 | " | 3,700 |
| 42 | " | SrO 49.00 | $MnO_2$ 3.5 | $WO_3$ $La_2O_3$ | 0.12 0.3 | " | 7,000 |
| 43 | " | SrO 49.00 | $MnO_2$ 3.5 | $WO_3$ $CeO_2$ | 0.12 0.3 | " | 1,500 |
| 44 | " | SrO 49.00 | $MnO_2$ 3.5 | $WO_3$ $Fe_2O_3$ | 0.12 0.3 | " | 37,000 |
| 45 | " | SrO 49.00 | $MnO_2$ 3.5 | $WO_3$ $Sb_2O_3$ | 0.12 0.3 | " | 49,000 |
| 46 | " | SrO 49.00 | $MnO_2$ 3.5 | $WO_3$ $Nb_2O_5$ | 0.12 0.38 | " | 2,200 |
| 47 | " | SrO 49.00 | $MnO_2$ 3.5 | $WO_3$ $La_2O_3$ | 0.12 0.38 | " | 4,500 |
| 48 | " | SrO 49.00 | $MnO_2$ 3.5 | $WO_3$ $CeO_2$ | 0.12 0.38 | " | 1,700 |
| 49 | " | SrO 39.00 CaO 10.00 | $MnO_2$ 3.5 | $WO_3$ $La_2O_3$ | 0.15 0.3 | " | 7,500 |
| 50 | " | SrO 39.00 CaO 10.00 | $MnO_2$ 3.5 | $WO_3$ $CeO_2$ | 0.15 0.3 | " | 3,000 |
| 51 | " | SrO | $MnO_2$ 3.5 | $WO_3$ | 0.15 | " | 1,500 |

TABLE 3-continued

| Reference Example No. | Semiconductor porcelain composition ||||| Grain boundary insulating agent component(s) | Dielectric constant (*specific dielectric constant; others are apparent specific dielectric constant) |
|---|---|---|---|---|---|---|---|
| | Main components (mol %) ||  Sintering aid  || Semi-conductiviz- ing agent mol parts based on 100 mol parts of main components || | |
| | $TiO_2$ | SrO, etc. | | | | | |
| | | 39.00 | | | $La_2O_3$ 0.3 | | |
| | | BaO 10.00 | | | | | |
| 52 | " | SrO 39.00 | $MnO_2$ | 3.5 | $WO_3$ 0.15 $CeO_2$ 0.3 | " | 4,800 |
| | | BaO 10.00 | | | | | |
| 53 | " | SrO 49.00 | $MnO_2$ | 3.1 | $WO_3$ 0.12 | $Na_2O$ | 82,000 |
| 54 | " | SrO 49.00 | $MnO_2$ | 3.1 | $WO_3$ 0.12 $Nb_2O_5$ 0.3 | " | 4,000 |
| 55 | " | SrO 49.00 | $MnO_2$ | 3.1 | $WO_3$ 0.12 $La_2O_3$ 0.3 | " | 7,700 |
| 56 | " | SrO 49.00 | $MnO_2$ | 3.1 | $WO_3$ 0.12 $CeO_2$ 0.3 | " | 1,800 |
| 57 | " | SrO 49.00 | $MnO_2$ | 3.1 | $WO_3$ 0.12 $Fe_2O_3$ 0.3 | " | 40,000 |
| 58 | " | SrO 49.00 | $MnO_2$ | 3.1 | $WO_3$ 0.12 $Sb_2O_3$ 0.3 | " | 52,000 |

TABLE 4

| Example | $C_1$ | $C_2$ | Dielectric constant | Dielectric loss (%) | Insulating resistance (MΩ) | Temperature change rate of dielectric constant (%, Standard: 25° C.) ||
|---|---|---|---|---|---|---|---|
| | | | | | | −25° C. | +85° C. |
| 10 | 5 | 1 | 101,000 | 0.7 | 4,300 | +7.9 | −6.7 |
| 11 | 7 | 11 | 90,000 | 1.0 | 4,200 | +6.2 | +6.0 |
| 12 | 5 | 14 | 101,000 | 0.7 | 4,300 | +7.0 | −6.7 |
| 13 | 5 | 15 | " | " | " | " | " |
| 14 | 5 | 16 | " | " | " | " | " |
| 15 | 5 | 17 | " | " | " | " | " |
| 16 | 5 | 18 | " | " | " | " | " |
| 17 | 6 | 19 | 105,000 | 0.9 | 4,400 | +6.6 | −6.5 |
| 18 | 6 | 20 | " | " | " | +6.6 | −6.5 |
| 19 | 6 | 21 | " | " | " | +6.6 | −6.5 |
| 20 | 12 | 22 | 78,000 | 0.7 | 4,600 | +6.2 | −5.9 |
| 21 | 12 | 23 | " | " | " | +6.2 | −5.9 |
| 22 | 13 | 24 | 85,000 | 0.8 | 4,200 | +7.1 | −6.8 |
| 23 | 13 | 25 | " | " | " | +7.1 | −6.8 |
| 24 | 26 | 26 | 82,000 | 0.7 | 4,200 | +7.8 | −7.5 |
| 25 | 26 | 28 | " | " | " | +7.8 | −7.5 |
| 26 | 26 | 29 | " | " | " | +7.8 | −7.5 |
| 27 | 26 | 30 | " | " | " | +7.8 | −7.5 |
| 28 | 26 | 31 | " | " | " | +7.8 | −7.5 |

TABLE 5

| Example No. | Molding composition ||||| Component of semi-conductivizing agent layer | Grain boundary insulating agent | Dielectric constant ||
|---|---|---|---|---|---|---|---|---|---|
| | Main components (mol %) || Sintering aid || Semi-conductiviz- ing agent mol parts based on 100 mol parts of main components | | | Region where no diffusion of semi-conduc- tivizing agent layer is effected | Region where diffusion of semi-conduc- tivizing agent layer is effected |
| | $TiO_2$ | SrO, etc. | | | | | | | |
| 29 | 51.0 | 49.0 | ZnO | 10.9 | $Y_2O_3$ 0.7 | $Y_2O_3$ | $Bi_2O_3$ | 56,000 | 6,500 |
| 30 | " | " | ZnO | 10.9 | $L_2O_3$ 0.7 | $Nb_2O$ | " | 47,000 | 7,800 |
| 31 | " | " | ZnO | 10.9 | $Dy_2O_3$ 0.7 | $Nb_2O_5$ | " | 53,000 | 7,200 |
| 32 | " | SrO | ZnO | 10.9 | $Y_2O_3$ 0.15 | $Nb_2O_5$ | $Bi_2O_3$ | 38,000 | 6,200 |

TABLE 5-continued

| | Molding composition | | | | | | | Dielectric constant | |
|---|---|---|---|---|---|---|---|---|---|
| | Main components (mol %) | | Sintering aid | | Semi-conductiv- izing agent mol parts based on 100 mol parts of main components | | Component of semi- conductivizing agent layer | Grain boundary insulating agent | Region where no diffusion of semi-conduc- tivizing agent layer is effected | Region where diffusion of semi-conduc- tivizing agent layer is effected |
| Example No. | TiO$_2$ | SrO, etc. | | | | | | | | |
| 33 | " | 39.0 CaO 10.0 SrO 47.0 BaO 2.0 | ZnO | 10.9 | Y$_2$O$_3$ | 0.15 | Nb$_2$O$_5$ CuO = 9:1 CuO = 9:1 | Bi$_2$O$_3$ | 42,000 | 6,300 |
| 34 | 50.5 | 49.5 | MnO$_2$ | 0.3 | Yb$_2$O$_3$ | 0.5 | Yb$_2$O$_3$ CuO = 9:1 | Bi$_2$O$_3$ | 48,000 | 5,400 |
| 35 | " | " | " | 0.8 | Eu$_2$O$_3$ | 0.8 | Eu$_2$O$_3$ | Bi$_2$O$_3$: CuO = 9:1 | 40,000 | 4,400 |
| 36 | " | " | " | 1.2 | Sm$_2$O$_3$ | 1.5 | Pm$_2$O$_3$ | Bi$_2$O$_3$: CuO = 9:1 | 43,000 | 3,600 |
| 37 | " | " | " | 2.0 | Sm$_2$O$_3$ Pr$_2$O$_3$ | 0.2 0.4 | Pm$_2$O$_3$ | Bi$_2$O$_3$: CuO = 9:1 | 47,000 | 6,100 |
| 38 | " | " | " | 2.0 | Nb$_2$O$_3$ | 0.3 | Nb$_2$O$_3$ | Bi$_2$O$_3$ | 42,000 | 6,200 |

TABLE 6

| | Molding composition | | | | | | | Dielectric constant | |
|---|---|---|---|---|---|---|---|---|---|
| | Main components (mol %) | | Sintering aid | | Semi-conductiv- izing agent mol parts based on 100 mol parts of main components | | Component of semi- conductivizing agent layer | Grain boundary insulating agent | Region where no diffusion of semi-conduc- tivizing agent layer is effected | Region where diffusion of semi-conduc- tivizing agent layer is effected |
| | TiO$_2$ | SrO, etc. | | | | | | | | |
| Reference Example No. | | | | | | | | | | |
| 59 | 51.0 | SrO 49.00 | MnO$_2$ | 3.5 | WO$_3$ | 0.12 | — | B$_2$O$_3$ | 101,000 | — |
| 60 | " | SrO 39.00 CaO 10.00 | MnO$_2$ | 3.5 | " | 0.15 | — | " | 78,000 | — |
| 61 | " | SrO 39.00 BaO 10.00 | MnO$_2$ | 3.5 | " | " | — | " | 85,000 | — |
| 62 | " | SrO 49.00 | MnO$_2$ | 3.1 | " | 0.12 | — | Na$_2$O | 82,000 | — |
| Example No. | | | | | | | | | | |
| 39 | " | SrO 49.00 | MnO$_2$ | 3.5 | WO$_3$ | 0.12 | Nb$_2$O$_3$ | B$_2$O$_3$ | 101,000 | 1,400 |
| 40 | " | SrO 49.00 | MnO$_2$ | 3.5 | " | " | La$_2$O$_3$ | " | " | 4,000 |
| 41 | " | SrO 49.00 | MnO$_2$ | 3.5 | " | " | CeO$_2$ | " | " | 1,000 |
| 42 | " | SrO 49.00 | MnO$_2$ | 3.5 | " | " | Fe$_2$O$_3$ | " | " | 45,000 |
| 43 | " | SrO 49.00 | MnO$_2$ | 3.5 | " | " | Sb$_2$O$_3$ | " | " | 64,000 |
| 44 | " | SrO 49.00 CaO 10.00 | MnO$_2$ | 3.5 | " | " | La$_2$O$_3$ | " | " | 6,500 |
| 45 | " | SrO 39.00 | MnO$_2$ | 3.5 | " | " | CeO$_2$ | " | " | 2,800 |

TABLE 6-continued

| | Molding composition | | | | | | Dielectric constant | |
|---|---|---|---|---|---|---|---|---|
| | Main components (mol %) | | Sintering aid | Semi-conductiviz-ing agent mol parts based on 100 mol parts of main components | Component of semi-conductivizing agent layer | Grain boundary insulating agent | Region where no diffusion of semi-conduc-tivizing agent layer is effected | Region where diffusion of semi-conduc-tivizing agent layer is effected |
| | $TiO_2$ | SrO, etc. | | | | | | |
| 46 | " | CaO 10.00 SrO 39.00 | $MnO_2$ | 3.5 | " | " | $La_2O_3$ | " | " | 6,400 |
| 47 | " | BaO 10.00 SrO 49.00 | $MnO_2$ | 3.5 | " | " | $CeO_2$ | " | " | 3,100 |
| 48 | " | SrO 49.00 | $MnO_2$ | 3.5 | " | " | $WO_3$ | " | " | 4,200 |
| 49 | " | SrO 49.00 | $MnO_2$ | 3.5 | " | " | $Nb_2O_5$ | $Na_2O$ | 82,000 | 4,000 |
| 50 | " | SrO 49.00 | $MnO_2$ | 3.5 | " | " | $La_2O_3$ | " | " | 7,700 |
| 51 | " | SrO 49.00 | $MnO_2$ | 3.5 | " | " | $CeO_2$ | " | " | 1,500 |
| 52 | " | SrO 49.00 | $MnO_2$ | 3.5 | " | " | $Fe_2O_3$ | " | " | 44,000 |
| 53 | " | SrO 49.00 | $MnO_2$ | 3.5 | " | " | $Sb_2O_3$ | " | " | 56,000 |

What is claimed is:

1. A ceramic substrate having two or more functional regions separated from each other, said substrate comprising: a first region comprising a first dielectric porcelain with a first dielectric constant, said first dielectric porcelain comprising a material selected from the group consisting of SrO and $TiO_2$ or BaO and $TiO_2$, and containing a first amount of semiconductivizing agent, and a second region comprising a second dielectric porcelain with a second dielectric constant different from the first dielectric constant, said second dielectric porcelain comprising a material selected from the group consisting of SrO and $TiO_2$ or BaO and $TiO_2$ and containing a second amount of the semiconductivizing agent, said second amount being different from said first amount in the first region so as to vary electrical characteristics between the regions, and, wherein the semiconductivizing agent is at least one selected from the group consisting of Y, Dy, Ln, Nb, Sb, Ta, Ce, Nd, Al, Cd, $Pr_2O_3$, $ThO_2$, $Pm_2O_3$, $Sm_2O_3$, $Eu_2O_3$, $Lu_2O_3$, $Tb_2O_3$, $Tm_2O_3$, $WO_3$, $Ln_2O_3$ and $Fe_2O_3$.

2. A ceramic substrate according to claim 1, wherein the first dielectric porcelain has a dielectric constant of 35000 or more.

3. A ceramic substrate according to claim 1, wherein the dielectric constant of the first dielectric porcelain is 5 times or more that of the second dielectric porcelain.

4. A ceramic substrate according to claim 1, wherein a part of Ti in TiO2 is substituted with at least one of Zr and Sn.

5. A ceramic substrate according to claim 1, wherein the first dielectric porcelain comprises BaO and $TiO_2$.

6. A ceramic substrate according to claim 1, wherein the second dielectric porcelain comprises BaO and $TiO_2$.

7. A ceramic substrate according to claim 1, wherein the ceramic substrate further includes functional portions which form at least one selected from the group consisting of capacitors, diodes and transistors.

8. A ceramic substrate according to claim 1, wherein the quantitative ratios of SrO and $TiO_2$ is 49.80 to 46.50 mol % for SrO and 50.20 to 53.50 mol % for $TiO_2$, based on 100 mol % of the total amount of SrO and $TiO_2$.

9. A ceramic substrate according to claim 1, wherein a part of Sr in the SrO is substituted with at least one selected from Ba, Ca, and Pb and Ti.

10. A ceramic substrate having two or more functional regions separated from each other, said substrate comprising a first region comprising a first dielectric porcelain with a first dielectric constant, said first dielectric porcelain comprising a material selected from the group consisting of SrO and $TiO_2$ or BaO and $TiO_2$, and containing a first semiconductivizing agent and a second region comprising a second dielectric porcelain with a second dielectric constant different from the first dielectric constant, said second dielectric porcelain comprising a material selected from the group consisting of SrO and $TiO_2$ or BaO and $TiO_2$ and containing a second semiconductivizing agent which is different from said first semiconductivizing agent in the region so as to vary electrical characteristics between the regions, wherein the semiconductivizing agent is at least one selected from the group consisting of Y, Dy, Sa, Nb, Sb, Ta, Ce, Nd, Al, Cd, $Pi_2O_3$, $ThO_2$, $Pm_2O_3$, $Sm_2O_3$, $Eu_2O_3$, $Lu_2O_3$, $Tb_2O_3$, $Tm_2O_3$, $Yb_2O_3$, $WO_3$, $La_2O_3$ and $Fe_2O_3$.

11. A ceramic substrate according to claim 10, wherein the first dielectric porcelain has a dielectric constant of 35000 or more.

12. A ceramic substrate according to claim 10, wherein the dielectric constant of the first dielectric porcelain is 5 times or more that of the second dielectric porcelain.

13. A ceramic substrate according to claim 10, wherein the quantitative ratios of SrO and $TiO_2$ is 49.80 to 46.50 mol % for SrO and 50.20 to 53.50 mol % for $TiO_2$, based on 100 mol % of the total amount of SrO and $TiO_2$.

14. A ceramic substrate according to claim 10, wherein a part of Sr in the SrO is substituted with at least one selected from Ba, Ca and Pb.

15. A ceramic substrate according to claim 10, wherein a part of Ti in TiO2 is substituted with at least one of Zr and Sn.

16. A ceramic substrate according to claim 10, wherein the first dielectric porcelain is composed mainly of BaO and $TiO_2$.

17. A ceramic substrate according to claim 10, wherein the second dielectric porcelain is composed mainly of BaO and $TiO_2$.

18. A ceramic substrate according to claim 10, wherein the ceramic substrate further includes functional portions which form at least one selected from the group consisting of capacitors, diodes and transistors.

* * * * *

UNITED STATES PATENT AND TRADEMARK OFFICE
CERTIFICATE OF CORRECTION

PATENT NO. : 5,571,761

DATED : November 5, 1996

INVENTOR(S) : MOTOO KUMAGAI ET AL.

It is certified that error appears in the above-identified patent and that said Letters Patent is hereby corrected as shown below:

[56] REFERENCES CITED

Insert --[56] References Cited
          U.S. PATENT DOCUMENTS
          4,654,750  3/1987  Kumagai  361/321
          4,759,965  7/1988  Kato et al.  421/138--.

COLUMN 2

Line 42, "views" should read --view--.
    Line 58, "view" should read --views--.

COLUMN 3

Line 8, "regions,a" should read --regions, a--.
    Line 9, "separate" should read --separate from--.
    Line 48, "regional" should read --regions--.

COLUMN 4

Line 16, "TIO$_2$," should read --TiO$_2$,--.
    Line 40, "AS" should read --As--.

UNITED STATES PATENT AND TRADEMARK OFFICE
CERTIFICATE OF CORRECTION

PATENT NO. : 5,571,761

DATED : November 5, 1996

INVENTOR(S) : MOTOO KUMAGAI ET AL.

It is certified that error appears in the above-identified patent and that said Letters Patent is hereby corrected as shown below:

COLUMN 5

Line 26, "balance of" should read --balance--.
    Line 28, "insulting" should read --insulating--.
    Line 63, "below." should read -below--.
    Line 64, "component)" should read --component).--.

COLUMN 6

Line 46, "insulting" should read --insulating--.

COLUMN 8

Line 27, "region" should read --region a--.
    Line 61, "separately" should read --dividing--.
    Line 65, "resistors" should read --resistors,--.

COLUMN 9

Line 12, "desired the" should read --the desired--.
    Line 24, "advantages" should read --advantageous--.
    Line 48, "and" should read --and Examples.--.
    Line 59, "at a" should read --at--.

COLUMN 10

Line 12, "used" should read --use--.

COLUMN 11

Line 13, "the both" should read --both the--.

UNITED STATES PATENT AND TRADEMARK OFFICE
CERTIFICATE OF CORRECTION

PATENT NO.  : 5,571,761

DATED       : November 5, 1996

INVENTOR(S) : MOTOO KUMAGAI ET AL.

It is certified that error appears in the above-identified patent and that said Letters Patent is hereby corrected as shown below:

COLUMN 12

Line 4, "3360°C." should read --1360°C.--.
Line 6, "the both" should read --both the--.
Line 20, "space" should read --spaced--.

COLUMN 15

Table 3, Example 28, "$WO_3$" should read -- O --.

Table 3, Example 39, Table 3, " $\underset{WO_3}{O}$ " should read --$WO_3$--.

Line 40, "AS" should read --As--.

COLUMN 19

Table 5, Examples 32-34,

"CuO=9:1                                                      --              CuO=9:1

$Nb_2O_5$    $Bi_2O_3$       should read       $Nb_2O_5$    $Bi_2O_3$
CuO=9:1                                                                       CuO=9:1

$Yb_2O_3$    $Bi_2O_3$"                        $Yb_2O_3$    $Bi_2O_3$
CuO=9:1                                                                       CuO=9:1--

UNITED STATES PATENT AND TRADEMARK OFFICE
CERTIFICATE OF CORRECTION

PATENT NO. : 5,571,761

DATED : November 5, 1996

INVENTOR(S) : MOTOO KUMAGAI ET AL.

Page 4 of 5

It is certified that error appears in the above-identified patent and that said Letters Patent is hereby corrected as shown below:

COLUMN 21

Table 6, Examples 49-53, "3.5" should read --3.1--.
    Line 57, "TiO2" should read --$TiO_2$--.

COLUMN 22

Line 33, "from" should read --from the group consisting of--.
    Line 34, "Pb and Ti." should read --Pb.--.
    Line 49, "Sa," should read --La,--.
    Line 64, "from" should read --from the group consisting of--.
    Line 66, "TiO2" should read --$TiO_2$--.

UNITED STATES PATENT AND TRADEMARK OFFICE
CERTIFICATE OF CORRECTION

PATENT NO. : 5,571,761

DATED : November 5, 1996

INVENTOR(S) : MOTOO KUMAGAI ET AL.

It is certified that error appears in the above-identified patent and that said Letters Patent is hereby corrected as shown below:

COLUMN 23

Line 2, "is composed mainly of" should read --comprises--.
Line 5, "is composed mainly of" should read --comprises--.

Signed and Sealed this

Seventh Day of October, 1997

Attest:

BRUCE LEHMAN

Attesting Officer        Commissioner of Patents and Trademarks